United States Patent
Kainuma et al.

(10) Patent No.: US 10,520,936 B2
(45) Date of Patent: Dec. 31, 2019

(54) AUTOMATED SYSTEM CAPABLE OF ESTIMATING PORTION REQUIRING MAINTENANCE

(71) Applicant: FUJI CORPORATION, Chiryu (JP)

(72) Inventors: Makoto Kainuma, Nagoya (JP); Masatoshi Fujita, Anjyo (JP); Ryo Nagata, Okazaki (JP); Takashi Kido, Kariya (JP)

(73) Assignee: FUJI CORPORATION, Chiryu (JP)

( * ) Notice: Subject to any disclaimer, the term of this patent is extended or adjusted under 35 U.S.C. 154(b) by 415 days.

(21) Appl. No.: 14/902,201

(22) PCT Filed: Jul. 5, 2013

(86) PCT No.: PCT/JP2013/068497
§ 371 (c)(1),
(2) Date: Dec. 30, 2015

(87) PCT Pub. No.: WO2015/001659
PCT Pub. Date: Jan. 8, 2015

(65) Prior Publication Data
US 2016/0202671 A1    Jul. 14, 2016

(51) Int. Cl.
*G05B 23/02*    (2006.01)

(52) U.S. Cl.
CPC ................. *G05B 23/0245* (2013.01)

(58) Field of Classification Search
CPC .. G05B 23/0245; G05B 13/04; G05B 19/406; G05B 2219/42271; H05K 13/08
(Continued)

(56) References Cited

U.S. PATENT DOCUMENTS

| 5,708,586 A * | 1/1998 | Ikeda | G05B 19/404 700/186 |
| 6,138,078 A * | 10/2000 | Canada | G01R 31/343 318/490 |

(Continued)

FOREIGN PATENT DOCUMENTS

| JP | 56-132607 A | 10/1981 |
| JP | 11-065608 A | 3/1999 |

(Continued)

OTHER PUBLICATIONS

Combined Office Action and Search Report dated May 2, 2017 in Chinese Patent Application No. 201380078034.6 (with partial English translation and English translation of category of cited documents).

(Continued)

*Primary Examiner* — Brian W Wathen
*Assistant Examiner* — Christopher W Carter
(74) *Attorney, Agent, or Firm* — Oblon, McClelland, Maier & Neustadt, L.L.P.

(57) ABSTRACT

An automated system including a control target device and a control device which controls the control target device, in which it is possible to accurately estimate whether maintenance of the control target device is required and a portion requiring maintenance. The control device is an adaptive control device including a position control system, an adaptive identifier which estimates a parameter indicating a state of a control target device based on a control command and a control target output from the control target device, and an adaptive compensator which, based on the parameter which is estimated by the adaptive identifier, compensates the control command from the position control system to the control target device such that the control target device (Continued)

performs a planned operation regardless of a change in the parameter.

20 Claims, 3 Drawing Sheets

(58) Field of Classification Search
USPC .......................................................... 700/52
See application file for complete search history.

(56) References Cited

U.S. PATENT DOCUMENTS

| | | | |
|---|---|---|---|
| 7,103,439 B1* | 9/2006 | Bode | G05B 19/41865 700/121 |
| 8,707,838 B2* | 4/2014 | Supe-Dienes | B26D 7/2635 83/500 |
| 2008/0183336 A1 | 7/2008 | Dykstra | |
| 2009/0101443 A1* | 4/2009 | Kawai | F16N 25/02 184/7.4 |
| 2010/0017049 A1 | 1/2010 | Swearingen et al. | |
| 2010/0147627 A1* | 6/2010 | Lakomiak | F16C 33/6674 184/7.4 |
| 2011/0173496 A1* | 7/2011 | Hosek | G05B 23/0235 714/26 |
| 2013/0110464 A1* | 5/2013 | Ishida | H05K 13/021 702/183 |
| 2016/0347470 A1 | 12/2016 | Swearingen et al. | |

FOREIGN PATENT DOCUMENTS

| | | |
|---|---|---|
| JP | 2003-208230 A | 7/2003 |
| JP | 2005-198404 A | 7/2005 |
| JP | 2006-333594 A | 12/2006 |
| JP | 2011-159699 A | 8/2011 |
| JP | 2012-128583 A | 7/2012 |

OTHER PUBLICATIONS

Extended European Search Report dated Jan. 9, 2017 in patent application No. 13888562.9.
Office Action dated Apr. 18, 2017 in Japanese Patent Application No. 2015-524985 (with unedited computer generated English translation).
International Search Report dated Oct. 8, 2013, in PCT/JP2013/068497 Filed Jul. 5, 2013.

* cited by examiner

AUTOMATED SYSTEM CAPABLE OF ESTIMATING PORTION REQUIRING MAINTENANCE

TECHNICAL FIELD

The present invention relates to an automated system including a control target device such as an electronic-circuit-component mounting machine and a control device which controls the control target device. In particular, the present invention relates to technology in which, when the control target device enters a state of requiring maintenance, the technology is capable of quickly detecting this fact, and desirably, is capable of estimating a portion requiring maintenance.

BACKGROUND ART

PTL 1 which is noted below describes an invention which, when an abnormality arises in an electronic-circuit-component mounting machine, presents a cause of the abnormality. The invention of PTL 1 stores an occurrence state of a mounting mistake of a component in the electronic-circuit-component mounting machine in a memory device, converts a correspondence relationship between the occurrence state of the mounting mistake and the cause thereof into an expression, and, when a mounting mistake actually occurs, estimates the cause based on the expression; in particular, the invention amends the expression of the correspondence relationship according to the environment in which the device is installed.

PTL 2 which is noted below describes an invention which, from time series data obtained by performing sequential observations over time of equipment and the like which forms a plant, sets two items of data for which it is estimated that there is a causal relationship therebetween as input data and output data, extracts information relating to responsiveness of the output data with respect to the input data for each type of variation unique to a control system such as a rising trend, a falling trend, or an oscillating trend of the input data, and acquires candidates of abnormality data from a deviation of the information relating to the responsiveness.

CITATION LIST

Patent Literature

PTL 1: JP-A-2011-159699
PTL 2: JP-A-2012-128583

SUMMARY

Technical Problem

Both of these inventions store data of past abnormality occurrence states in a memory device, and, when an abnormality actually arises or a sign of an abnormality occurrence appears, estimate the cause of the abnormality occurrence based on the data of the past abnormality occurrence states.

In contrast, the present invention is an automated system capable of quickly detecting that a control target device has entered a state of requiring maintenance based on a completely different concept, and desirably, capable of performing estimation of the abnormality cause or the portion requiring maintenance.

In other words, the present invention is an automated system including a control target device and a control device which controls the control target device, in which the control device is an adaptive control device including (a) a controller which outputs a control command to the control target device, (b) an adaptive identifier which estimates one or more parameters indicating a state of the control target device based on the control command which is output from the controller and a control target output which is output from the control target device, and (c) an adaptive compensator which, based on the one or more parameters which are estimated by the adaptive identifier, compensates the control command from the controller to the control target device such that the control target device performs a planned operation regardless of a change in the one or more parameters; and the adaptive control device further includes a maintenance requirement detecting section which detects that the control target device is in a state of requiring maintenance based on the one or more parameters which are estimated by the adaptive identifier, and, more desirably, is provided with a portion-requiring-maintenance estimation section which estimates a portion of the control target device which requires maintenance.

Advantageous Effects

Although adaptive control is characterized in changing parameters of a model of a control target device according to changes in a situation and always being capable of achieving an objective favorably regardless of changes in the situation using control according to the situation, if considered from the opposite perspective, adaptive control can be control capable of quickly and numerically ascertaining state changes of the control target device by observing changes in the parameters. Making positive use of this point, the present invention quickly ascertains an indication of an abnormality or an abnormality of the control target device and detects that the control target device enters a state of requiring maintenance, and desirably, further estimates the portion requiring maintenance.

Conventionally, discovering an abnormality in the output and determining the cause are performed; however, even if an abnormality arises in the output, it is generally difficult to ascertain this. Regarding this, if based on the changes in the parameters which are obtained in adaptive control, it is possible to quickly discover an indication of an abnormality or an abnormality, and it is possible to increase the precision of estimation of the cause of the abnormality. For example, it is possible to acquire changes in the properties of the control target device such as the friction force of a relative moving portion, the thrust constant of a linear motor which is a drive source, the torque constant of a rotating motor, and the resonance frequency of the constituent elements such as the device main body, with numerical values as changes in parameters. Therefore, it is possible to quickly detect that an indication of an abnormality or an abnormality has arisen in the control target device and that maintenance is required, and taking the process a step further, it is possible to avoid the occurrence of an abnormality beforehand, or to estimate, with high precision, the portion requiring maintenance in order to solve the abnormality.

In the control target device, although it is essential to perform maintenance such as replenishing of a lubricant, and cleaning or exchanging of a filter, since the device must be stopped while the maintenance is performed, leading to reduced throughput, a longer interval for performing maintenance is preferable. However, there is a danger that, if maintenance is performed late, this will lead to failure of the device. According to the present invention, it is possible to automatically detect that a state of requiring maintenance is entered and the portion requiring maintenance, it becomes possible to perform maintenance at an appropriate time, and it is possible to favorably avoid both a reduction in throughput caused by excessive maintenance and a generation of failures caused by insufficient maintenance.

DESCRIPTION OF EMBODIMENTS

Hereinafter, description will be given of an electronic-circuit-component mounting machine (hereinafter shortened to a mounting machine) as an example of a circuit substrate working device which is an embodiment of the present invention, with reference to the drawings. Note that, in addition to the embodiment described below, it is possible to embody the present invention with various modifications based on the knowledge of a person skilled in the art.

Figure 2:
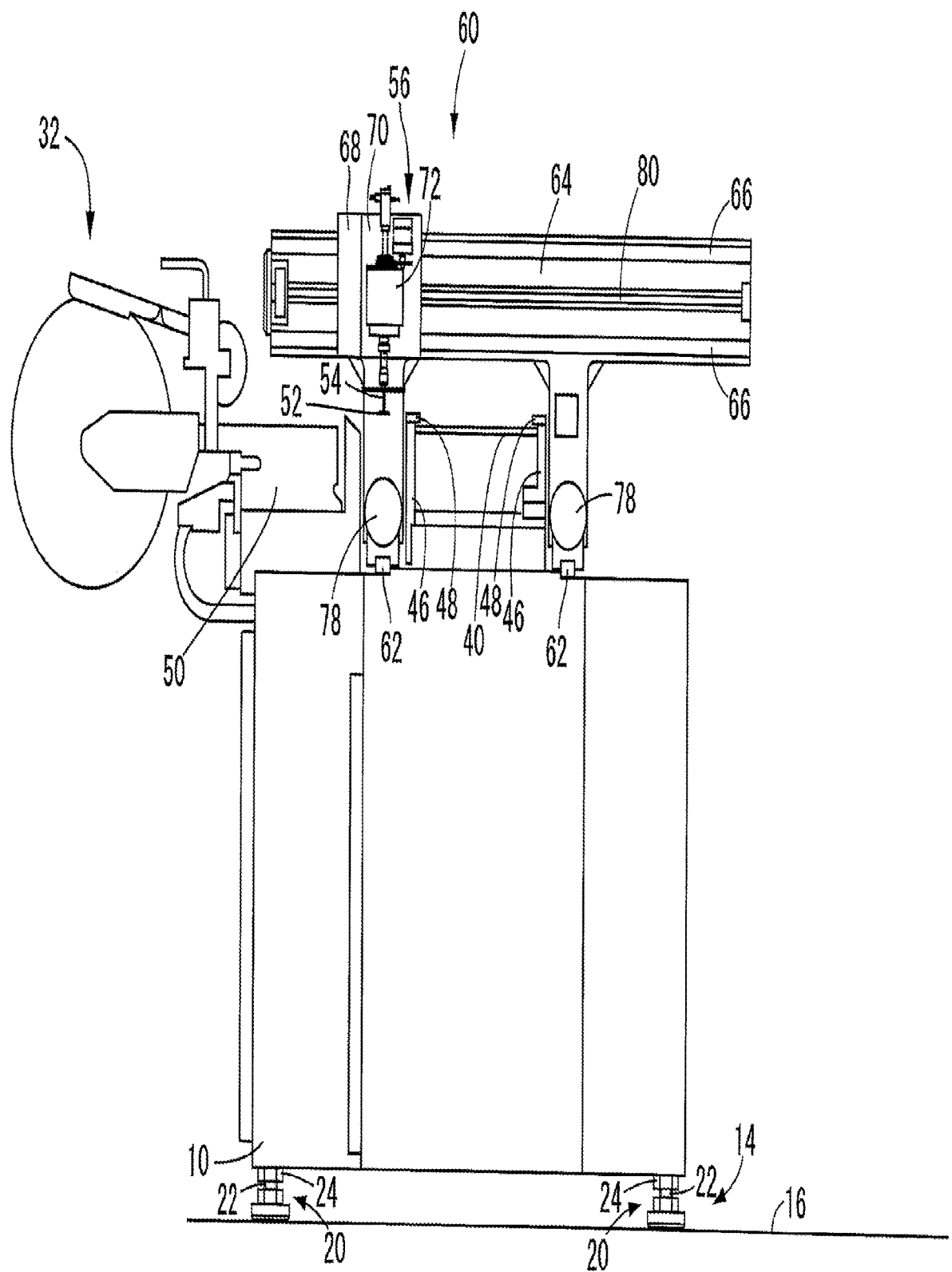
FIG. 2 is a side view illustrating the electronic-circuit-component mounting machine.

A mounting machine 10 is provided with a mounting machine main body 12, and, as illustrated in FIG. 2, the mounting machine main body 12 is installed on a floor surface 16 via a leveling device 14. It is possible to adopt various devices as the leveling device 14, and in FIG. 2, a device including four height adjustment screw devices 20 is exemplified. Each of the height adjustment screw devices 20 is formed of a female screw hole which is formed in the mounting machine main body 12 and is omitted from the drawings, a leveling bolt 22 which is provided with a head portion which is supported on the floor surface 16 and a male screw portion which is screwed into the female screw hole, and a lock nut 24 which is screwed onto the leveling bolt 22. The height adjustment screw devices 20 cause four portions of the mounting machine main body 12 to be uniformly supported on the floor surface 16 regardless of the degree of flatness of the floor surface 16 by adjusting the screwing amount of the leveling bolts 22 into the female screw holes, thus the mounting machine main body 12 is maintained horizontal with good precision.

A substrate conveyance holding device 30, a component supply device 32, and a mounting device 34 are arranged on the mounting machine main body 12. The substrate conveyance holding device 30 includes a pair of belt conveyors 42 which support and convey both side edge portions of a circuit board 40 which is an example of a circuit substrate, and a lifting and lowering base 44 which is arranged between the pair of belt conveyors 42 to be capable of lifting and lowering. In the lifted position, the lifting and lowering base 44 interposes and fixes the both side edge portions of the circuit board 40 in cooperation with bearing members 48 of a longitudinal shape which are fixed to the top end of a pair of conveyor rails 46 (refer to FIG. 2) of the belt conveyors 42.

The component supply device 32 is arranged on one side or both sides of the substrate conveyance holding device 30 and includes a plurality of feeders (in the illustrated example, tape feeders 50) which each supply one type of electronic circuit component (hereinafter referred to as a component). The mounting device 34 receives components from the plurality of tape feeders 50 and mounts the components on the circuit board 40 which is held in a fixed position by the substrate conveyance holding device 30. For this, as illustrated in FIG. 2, the mounting device 34 is provided with a mounting head 56 which is provided with a component holding tool (in the illustrated example, a suction nozzle 54 which picks up and holds a component 52 using a negative pressure) which holds the component 52, and a suction nozzle moving device 60 which is a holding tool moving device which causes the suction nozzle 54 to move in X, Y, and Z axial directions which orthogonally intersect each other. The suction nozzle moving device 60 includes an X-axis slide 64 capable of sliding on a pair of X-axis guide rails 62 (refer to FIG. 2), a Y-axis slide 68 capable of sliding on a pair of Y-axis guide rails 66 (refer to FIG. 2) which is provided on the X-axis slide 64, a head main body 70 capable of being mounted to and detached from the Y-axis slide 68, and a Z-axis actuator 72 which is held by the head main body 70.

Figure 1:
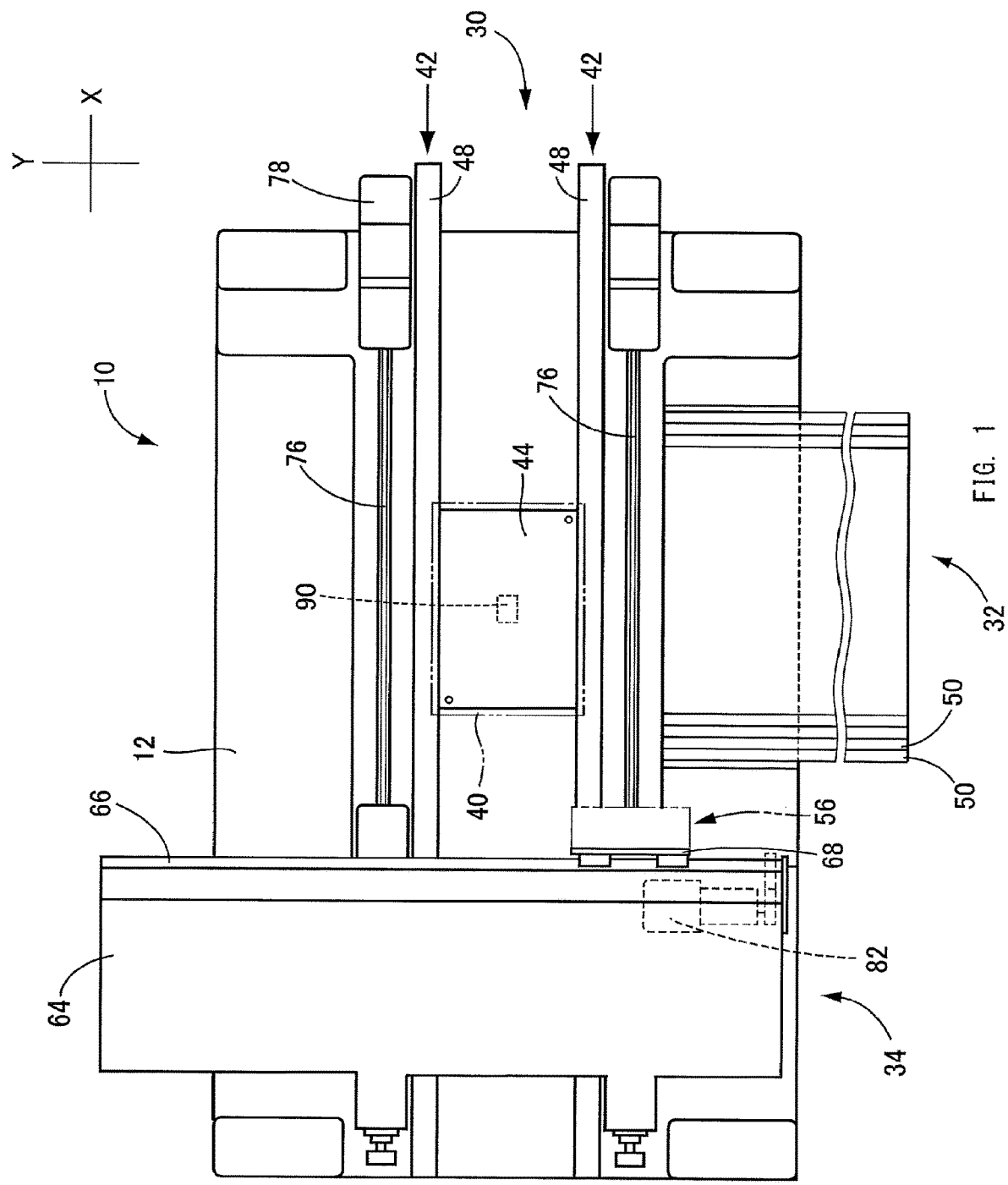
FIG. 1 is a plan view illustrating an electronic-circuit-component mounting machine which is an embodiment of the present invention.

The X-axis slide 64 is caused to move to any position in the X-axis direction by a pair of X-axis feed screws 76 (refer to FIG. 1) which are arranged in parallel on the pair of X-axis guide rails 62 and an X-axis motor 78 which rotationally drives the pair of X-axis feed screws 76. The Y-axis slide 68 is caused to move to any position in the Y-axis direction by a pair of Y-axis feed screws 80 which are arranged in parallel on the pair of Y-axis guide rails 66 and a Y-axis motor 82 (refer to FIG. 1) which rotationally drives the pair of Y-axis feed screws 80. The suction nozzle 54 is moved in the Z-axis direction by the Z-axis actuator 72 in relation to the Y-axis slide 68, that is, is caused to lift and lower in the vertical direction. An accelerometer which detects oscillation in the three axial directions X, Y, and Z is attached to the mounting machine main body 12 as an oscillation sensor 90. In FIG. 1, the single oscillation sensor 90 is depicted beneath the lifting and lowering base 44; however, for example, it is possible to provide the oscillation sensor 90 on a plurality of portions such as in positions above the plurality of height adjustment screw devices 20.

Figure 3:
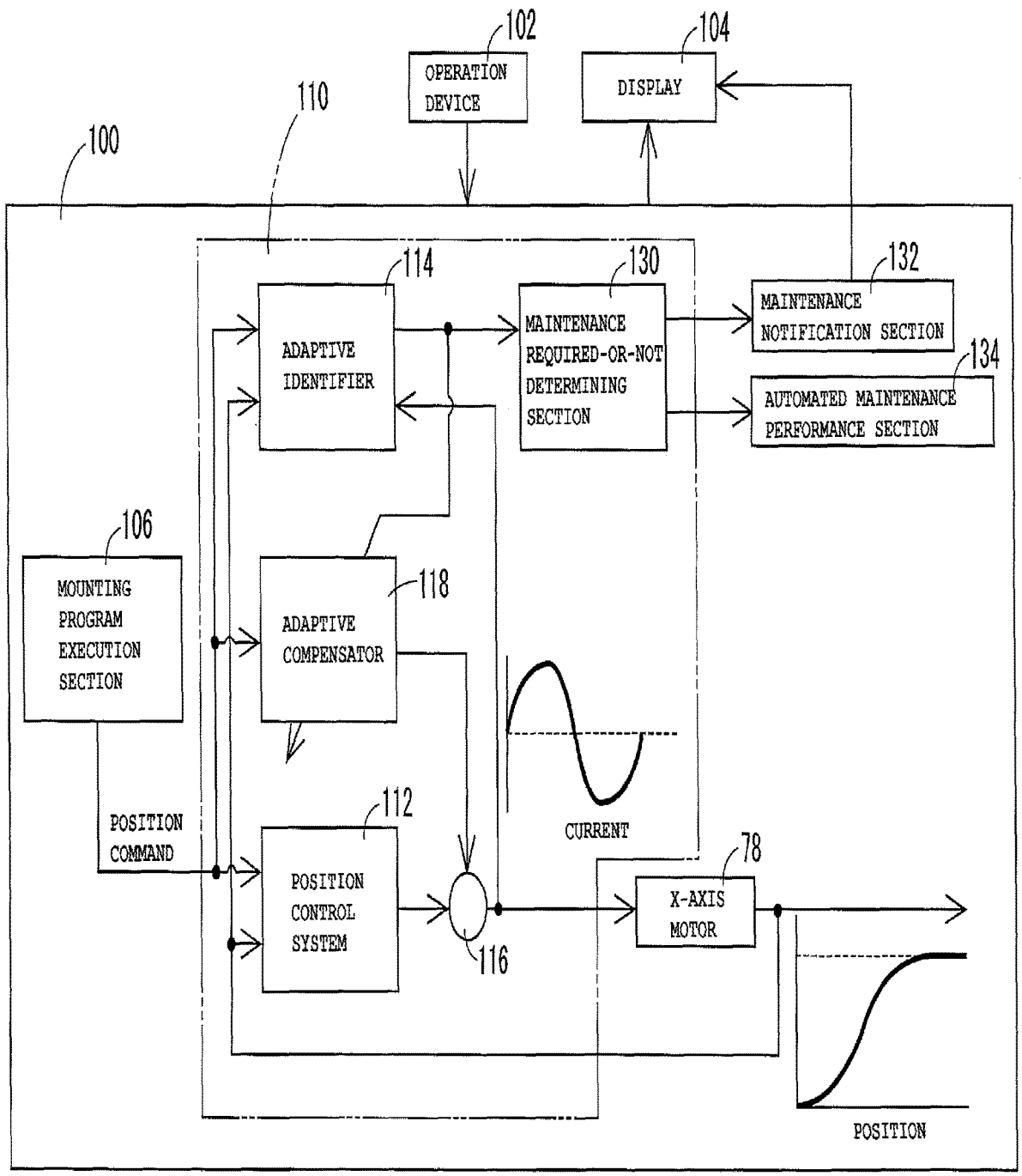
FIG. 3 is a block diagram illustrating, of control devices of the electronic-circuit-component mounting machine, an adaptive control section which controls an electric motor which is a drive source of a mounting device.

The mounting machine 10 is provided with a control device 100 (refer to FIG. 3) which controls the substrate conveyance holding device 30, the component supply device 32, the mounting device 34, and the like, and an operation device 102 which is operated by an operator and a display 104 are connected to the control device 100. An adaptive control section 110 is provided as a portion of the control device 100. Within the adaptive control section 110, FIG. 3 representatively illustrates portions relating to the X-axis motor 78. In a mounting program execution section 106, the control device 100 sequentially reads and executes a program relating to the mounting of the component 52 to the circuit board 40 from a program memory section, and based on this, position commands are issued to the X-axis motor 78. The adaptive control section 110 is provided with a position control system 112 for executing the position commands, and the adaptive control section 110 supplies a current to the X-axis motor 78. As conceptually illustrated in FIG. 3, the current is caused to change so as to decrease after increasing once in the positive direction, and subsequently decrease after increasing in the opposite direction. As a result, as conceptually illustrated in FIG. 3, the X-axis motor 78 rotates a predetermined amount and stops, such that the X-axis slide 64 is moved a predetermined distance in the X-axis direction and stopped.

The movement of the X-axis slide 64 based on the control of the supplied current described above is influenced by the torque constant of the X-axis motor 78 and the friction resistance of the X-axis slide 64. Since an encoder is provided in the X-axis motor 78 and the X-axis motor 78 is caused to operate until the output of the encoder reaches a set value, the X-axis slide 64 is reliably caused to stop at the set position; however, the changing state of the current is influenced by the torque constant of the X-axis motor 78 and the friction resistance of the X-axis slide 64. The main cause of fluctuation of the torque constant of the X-axis motor 78 is heat demagnetization of the magnet, and there is a case in which the heat demagnetization is reversible and a case in which the heat demagnetization is not reversible. The demagnetization during ordinary operation occurs with a rise in temperature of the magnet with continuous operation and is reversible and will recover if the temperature drops, and, since this is considered during the design of the mounting machine 10, there is no problem. However, even if the demagnetization is reversible, there are cases in which the demagnetization occurs due to an undesirable situation. A cooling fan and a filter which are omitted from the drawings are provided in the X-axis motor 78, and an abnormality in these is an example which can cause a greater temperature rise than ordinary in the X-axis motor 78. The cooling fan rotates corresponding to the rotation of the X-axis motor 78 and cools the X-axis motor 78; however, there are cases in which the rotation is insufficient due to an increase in the friction resistance caused by the sliding surface inside the fan peeling due to wear, being scratched by physical impact, or the like, or due to an increase in the friction resistance caused by insufficient lubricant such as grease, or the like, leading to the cooling of the X-axis motor 78 being insufficient, thus a temperature rise in excess of that which is planned occurs, and the magnet is subjected to demagnetization in excess of that which is planned. Also, the filter is provided on the inlet side of the cooling fan to remove dust and the like from the air which is blown into the X-axis motor 78; however, if the filter is clogged in excess of a permissible state, there are cases in which the cooling of the X-axis motor 78 is insufficient and the magnet is subjected to demagnetization in excess of that which is planned.

The friction resistance of the X-axis slide 64 is the friction resistance between the X-axis slide 64 and the X-axis guide rails 62 and the friction resistance between the X-axis feed screw 76 and the X-axis slide 64. If the lubrication between the X-axis slide 64 and the X-axis guide rails 62 is insufficient, the friction resistance increases. It is normal for a predetermined load (pre-load) to always act between the X-axis slide 64 and the X-axis guide rails 62 in order to cause the X-axis slide 64 to move smoothly without wobbling; however, if the lubricant such as grease is discharged, constituent elements of a relative moving portion (for example, the balls when the X-axis feed screw 76 is a ball screw) wear, the friction resistance decreases, and the friction resistance becomes greater than or less than the planned value. In either case, if the friction resistance of the X-axis slide 64 changes, the increasing and decreasing state of the current which is supplied from the position control system 112 changes. If the lubrication between the sliding surfaces is insufficient, this becomes a cause of scratch generation, and wear in excess of a permissible amount of the constituent elements of the relative moving portion becomes a cause of a decrease in precision of the positioning of the X-axis slide 64.

The demagnetization of the magnet and the change in the supplied current which are described above are solved by performing maintenance which includes inspecting the cooling fan, the filter, the relative moving portion and the like, and solving the cause which is discovered as a result (for example, supplying lubricant, changing the filter or the seal member, or the like). However, if a situation occurs in which the demagnetization of the magnet reaches an irreversible point, the torque constant of the X-axis motor 78 remains reduced, and there is a decrease in the power efficiency of the X-axis motor 78 and the throughput of the mounting machine 10. As a result of the inspection of the relative moving portion, for example, damage to the seal device or the cooling fan of the relative moving portion is discovered, or the occurrence of generation of scratches on the X-axis guide rails 62 is discovered. In this case, so-called repair maintenance such as replacing the X-axis motor 78, the seal device, or the cooling fan, or the removal of scratches of the guide rails becomes necessary.

As described above, since the torque constant of the X-axis motor 78 itself and the friction force of the relative moving portion which is driven by the X-axis motor 78 influence the operation of the X-axis motor 78, the adaptive control section 110 stores a model which is represented by an expression which includes the torque constant and the friction force as parameters, calculates the amount by which to increase or decrease the supplied current which is necessary for executing the position command based on the model, and amends a current command value which is supplied from the position control system. For this, the adaptive control section 110 is provided with an adaptive identifier 114 which estimates the torque constant of the X-axis motor 78 and the friction force of the relative moving portion based on the position commands which are supplied to the position control system 112 and position information which is fed back from the encoder of the X-axis motor 78, and an adaptive compensator 118 which calculates the current increase or decrease amount based on the torque constant and the friction force which are estimated by the adaptive identifier 114 and supplies the current increase or decrease amount to an adder 116. The model which is represented by the expression is defined as including set values which are expected due to design as values of the torque constant and the friction force at initialization; however, the values of the torque constant and the friction force in the actual mounting machine 10 are not always accurately equal to the set values, rather, in most cases the values differ by a certain degree, and, the values also change with the continued operation of the mounting machine 10. Therefore, the adaptive control section 110 controls the X-axis motor 78 such that, by repeating the estimation and the compensation in the adaptive identifier 114 and the adaptive compensator 118, the values of the torque constant and the friction force in the expression are caused to approach the actual torque constant and friction force, the inappropriate initial set values of the torque constant and the friction force are amended, in other words, regardless of fluctuations which accompany the continued operation of the mounting machine 10, the X-axis slide 64 is caused to complete the movement to the position as instructed by the position command as fast and accurately as possible.

In this manner, originally, the adaptive control section 110 is capable of causing the X-axis slide 64 to move favorably regardless of inappropriate initial set values of the torque constant and the friction force or fluctuations accompanying continued operation; however, the inventor of the present invention realized that the adaptive control section 110 repeats the estimation of the actual torque constant and friction force and the fluctuation of the estimated values of the torque constant and the friction force is small in a state in which the operation of the mounting machine 10 is stable, and that when the estimated values of the torque constant and the friction force change in excess of set values at a time at which the operation of the mounting machine 10 should be stable, it is possible to consider that this is a sign that some type of abnormality will occur, or that an abnormality has occurred in the X-axis motor 78 and the X-axis slide 64.

Therefore, as illustrated in FIG. 3, the inventor conceived of adding a maintenance required-or-not determining section 130, a maintenance notification section 132, and an automated maintenance performance section 134 to the adaptive control section 110. The maintenance required-or-not determining section 130 is a portion which determines whether the control target device has entered a state of requiring maintenance based on the changing states of the estimated values of the torque constant and the friction force which are obtained by the adaptive identifier 114, and specifically, for example, is capable of determining that "maintenance is required" when absolute values of the differences between the estimated values and the set values of the torque constant and the friction force are greater than or equal to threshold values.

Note that, here, the control target device is a portion which includes (a) the X-axis slide 64, (b) the X-axis motor 78 which is the drive source of the X-axis slide 64, (c) a movement conversion device formed of the X-axis feed screws 76 and a female screw portion which converts the rotation of the X-axis motor 78 to linear movement of the X-axis slide 64, and (d) the X-axis guide rails 62 which are a guide device which guides the movement of the X-axis slide 64. The maintenance notification section 132 is a portion which, when the maintenance required-or-not determining section 130 determines that maintenance is required, performs notification of the fact and the content of the required maintenance using the display 104, and the automated maintenance performance section 134 is a portion which performs maintenance which can be performed automatically, such as the supply of lubricant, for example. Of the maintenance, that which can be performed automatically is performed automatically by the automated maintenance performance section 134 and the fact is displayed on the display 104. For the maintenance which cannot be performed automatically, the operation of the mounting machine 10 is stopped, and the fact is displayed on the display 104.

While the above describes the X-axis slide 64 and the X-axis motor 78, the same type of adaptive control section may be provided for the Y-axis slide 68 and the Y-axis motor 82, a similar adaptive control section may be provided for the suction nozzle 54 and the Z-axis actuator 72, and the same or similar operations and effects may be obtained.

Note that, there is provided a lubricant replenishing interval acquisition section which, when the required maintenance in relation to the relative moving portion is the supply of lubricant thereto, acquires a lubricant replenishing interval which is an elapsed time from after the supply of lubricant according to the estimation carried out by the portion-requiring-maintenance estimation section is performed until it is estimated that the supply of lubricant to the same relative moving portion is required again or a cumulative operation time of the mounting machine 10 which is the control target device. When the lubricant replenishing interval which is acquired by the lubricant replenishing interval acquisition section is less than or equal to a set period, an abnormality notification device performs notification of the fact that the relative moving portion is in an abnormal state, and in addition to or instead of the notification, a relative movement prohibition section prohibits the operation of the suction nozzle moving device 60.

When maintenance is necessary for the drive source of the suction nozzle moving device 60 such as the X-axis motor 78, the Y-axis motor 82, and the Z-axis actuator 72, the drive source is caused to stop temporarily, the torque constant is detected again after a set time has elapsed from the stopping, and when the decrease in the torque constant is an irreversible decrease, it is possible to cause the display 104 to display the fact that it is necessary to exchange the drive source using the maintenance notification section 132.

Further, it is possible to provide the adaptive control section 110 with an adaptive identifier, an adaptive compensator, and a maintenance required-or-not determining section which, when a detected oscillation frequency deviates from a set frequency (the natural frequency of the mounting machine main body 12 when the leveling is performed correctly) by a set value or more as a result of the detection of the oscillation of the Y-axis slide 68 which is carried out by the oscillation sensor 90, for example, when the detected oscillation frequency is lower by the set value or more, perform determination that the support state of the mounting machine main body 12 by the leveling device 14 is inappropriate, and that re-leveling work or amendment of the leveling device 14 is necessary.

Also, together with, or instead of the oscillation sensor 90, an oscillation sensor of another portion may be provided, the oscillation frequency of a constituent element other than the mounting machine main body 12 such as, for example, a feed screw or a movement transmission mechanism may be detected, and, based on the detection result, determination indicating that the state (for example, the support state) of the other constituent element is abnormal maybe performed. Accordingly, it is possible to perform the appropriate maintenance at the appropriate time, and to avoid a reduction in throughput or mounting accuracy beforehand.

In the embodiment described above, the adaptive control section 110 controls the X-axis slide 64 and the like and the drive source of the suction nozzle moving device 60 so as to cause the suction nozzle 54 to complete the movement to a position as in a position command as quickly and accurately as possible regardless of the fluctuation which accompanies continued operation of the mounting machine 10; however, as the control side, it is naturally possible to adopt model reference control or the like which is generally adopted in adaptive control. In the identification of the model, as the information used in the identification, it is possible to use a changing state of a disturbance which is estimated by a disturbance observer as well as a changing state of the current in relation to position commands. Furthermore, as the algorithm which calculates the parameters in the identification, it is possible to adopt the least-squares method or the like in which a difference between the actual response of the device and the response which is originally appropriately perceived as an evaluation function, and the evaluation function is rendered as small as possible.

Above, description was given using the mounting machine 10 as an example; however, it is possible to apply the present invention to a circuit substrate working device other than the mounting machine 10, for example, a screen printer which prints solder paste onto a circuit board, an adhesive applier which applies an adhesive to a circuit substrate, a mounting state tester which tests the mounting state of electronic circuit components on a circuit substrate before melting or after melting of solder paste. More widely, it is possible to apply the present invention to manufacturing machines in general and other devices, for example, a device in which adaptive control is already adopted.

REFERENCE SIGNS LIST

10: electronic-circuit-component mounting machine (mounting machine), 12: mounting machine main body, 14: leveling device, 16: floor surface, 30: substrate conveyance holding device, 32: component supply device, 34: mounting device, 40: circuit board, 52: electronic circuit component (component), 54: suction nozzle, 56: mounting head, 60: suction nozzle moving device, 62: X-axis guide rail, 64: X-axis slide, 66: Y-axis guide rail, 68: Y-axis slide, 70: head main body, 72: Z-axis actuator, 76: X-axis feed screw, 78: X-axis motor, 80: Y-axis feed screw, 82: Y-axis motor, 90: oscillation sensor

The invention claimed is:

1. An automated system comprising:
a control target device; and
a control device which controls the control target device,
wherein the control device is an adaptive control device including
a controller which outputs a current control command to control the control target device based upon a position command received by the controller;
an adaptive identifier which estimates one or more parameters based on the position command and position information which is output from the control target device, the one or more parameters including one or more of a thrust constant, a torque constant, a friction force, and a resonance frequency;
an adaptive compensator which, based on the one or more parameters which are estimated by the adaptive identifier, calculates an amount by which to increase or decrease the current control command such that the control target device executes the position command regardless of a change in the one or more parameters; and
a maintenance requirement detecting section which detects that the control target device is in a state of requiring maintenance based on the one or more parameters which are estimated by the adaptive identifier.

2. The automated system according to claim 1, wherein the control device further comprises a portion-requiring-maintenance estimation section which estimates a portion requiring maintenance which is a portion of the control target device which requires maintenance based on the one or more parameters which are estimated by the adaptive identifier.

3. The automated system according to claim 2, wherein the control device further comprises at least one of:
a portion-requiring-maintenance notification section which performs notification of the portion requiring maintenance of the control target device based on estimation results of the portion-requiring-maintenance estimation section, and
an automatic maintenance section which automatically carries out required maintenance.

4. The automated system according to claim 2, wherein the one or more parameters include the friction force, which is a friction force in a relative moving portion of the control target device, and the portion requiring maintenance which is estimated by the portion-requiring-maintenance estimation section is the relative moving portion.

5. The automated system according to claim 4, wherein the control device further comprises:
a lubricant replenishing interval acquisition section which, when required maintenance in relation to the relative moving portion is a supply of lubricant to the relative moving portion, acquires a lubricant replenishing interval which is at least one of:
an elapsed time from after the supply of lubricant is performed until it is estimated that the relative moving portion is the portion requiring maintenance again by the portion-requiring-maintenance estimation section, and
a cumulative operation time of the control target device; and at least one of:
an abnormality notification device which performs notification of a fact that the relative moving portion is in an abnormal state, and
a relative movement prohibition section which prohibits relative movement of the relative moving portion when the lubricant replenishing interval which is acquired by the lubricant replenishing interval acquisition section is less than or equal to a set interval.

6. The automated system according to claim 2, wherein the one or more parameters include the natural frequency, which is a natural frequency of one or more constituent elements of the control target device, and
when the natural frequency of the one or more constituent elements changes by a set value or greater, the portion-requiring-maintenance estimation section estimates that the constituent element having the natural frequency is the portion requiring maintenance.

7. The automated system according to claim 6, wherein the control target device includes a plurality of constituent elements with different natural frequencies from each other, and
the portion-requiring-maintenance estimation section includes
a natural frequency memory section which associates a natural frequency of each of the plurality of constituent elements with each of the constituent elements and stores same; and
a constituent-element-requiring-maintenance estimation section which, when one of the plurality of natural frequencies which are stored in the natural frequency memory section changes by a set amount or more, estimates that a constituent element which is associated with the one of the plurality of natural frequencies is the portion requiring maintenance.

8. The automated system according to claim 6, wherein the one or more constituent elements include a main body frame of the control target device which is installed on a floor surface via a leveling device, and
the portion-requiring-maintenance estimation section includes a portion which estimates that the main body frame is the portion requiring maintenance.

9. The automated system according to claim 2, wherein the one or more parameters include the torque constant, which is a torque constant of an electrical actuator, or the thrust constant, which is a thrust constant of the electrical actuator, and
the portion requiring maintenance which is estimated by the portion-requiring-maintenance estimation section includes at least one of the electrical actuator itself and a cooling device which cools the electrical actuator.

10. The automated system according to claim 9, wherein the portion requiring maintenance includes at least one of a cooling fan and a filter of the cooling device.

11. The automated system according to claim 9, wherein the required maintenance for the electrical actuator itself includes causing the electrical actuator to stop temporarily and detecting the torque constant or the thrust constant after a set time has elapsed from the stopping, and, when a reduction in the detected constant is below a predetermined value, exchanging the electrical actuator.

12. The automated system according to claim 1, wherein the control target device is a circuit substrate working device which carries out predetermined work on a circuit substrate.

13. The automated system according to claim 12, wherein
the predetermined work on the circuit substrate includes a plurality of planned operations of a plurality of constituent elements of the circuit substrate working device,
one of the plurality of planned operations of the plurality of constituent elements of the circuit substrate working device includes driving a constituent element of the plurality of constituent elements to a predetermined position, and
the adaptive compensator calculates the amount by which to increase or decrease the current control command such the constituent element is driven to the predetermined position.

14. The automated system according to claim 12, wherein the circuit substrate working device is an electronic-circuit-component mounting machine including:
a substrate holding device which holds a circuit substrate; and
a mounting device, which is provided with a component holding tool which holds an electronic circuit component and a relative movement device which causes the component holding tool and the substrate holding device to move relatively, and mounts the electronic circuit component which is held by the component holding tool on the circuit substrate which is held by the substrate holding device.

15. The automated system according to claim 1, wherein the maintenance requirement detecting section detects that the control target device is in the state of requiring maintenance when the one or more parameters which are estimated by the adaptive identifier fluctuate in excess of one or more corresponding set values.

16. The automated system according to claim 15, wherein the maintenance requirement detecting section detects that the control target device is in the state of requiring maintenance when the one or more parameters which are estimated by the adaptive identifier fluctuate in excess of the one or more corresponding set values at a time at which operation of the control target device should be stable.

17. The automated system according to claim 1, wherein the maintenance requirement detecting section detects that the control target device is in the state of requiring maintenance when an absolute value of a difference between the one or more parameters which are estimated by the adaptive identifier and one or more corresponding set values of the one or more parameters is greater than or equal to one or more corresponding threshold values.

18. The automated system according to claim 1, wherein the control device further comprises an adder which compensates the current control command by adding the amount to the current control command such that the control target device executes the position command.

19. The automated system according to claim 1, wherein the amount is an amount by which to increase the current control command.

20. The automated system according to claim 1, wherein the amount is an amount by which to decrease the current control command.

* * * * *